United States Patent
Chang

(10) Patent No.: US 11,111,383 B2
(45) Date of Patent: Sep. 7, 2021

(54) RESIN COMPOSITION AND ARTICLE MADE THEREFROM

(71) Applicant: Elite Material Co., Ltd., Taoyuan (TW)

(72) Inventor: Shu-Hao Chang, Taoyuan (TW)

(73) Assignee: ELITE MATERIAL CO., LTD., Taoyuan (TW)

( * ) Notice: Subject to any disclaimer, the term of this patent is extended or adjusted under 35 U.S.C. 154(b) by 126 days.

(21) Appl. No.: 16/703,172

(22) Filed: Dec. 4, 2019

(65) Prior Publication Data

US 2021/0108075 A1 Apr. 15, 2021

(30) Foreign Application Priority Data

Oct. 14, 2019 (TW) ................. 108136851

(51) Int. Cl.

| | | |
|---|---|---|
| *C08L 71/12* | (2006.01) | |
| *C08F 212/36* | (2006.01) | |
| *C08L 67/00* | (2006.01) | |
| *C08L 77/00* | (2006.01) | |
| *C08L 33/08* | (2006.01) | |
| *C08L 33/24* | (2006.01) | |
| *C08K 5/01* | (2006.01) | |
| *C08J 5/24* | (2006.01) | |
| *C08L 63/00* | (2006.01) | |

(52) U.S. Cl.
CPC .......... *C08L 71/126* (2013.01); *C08F 212/36* (2013.01); *C08J 5/24* (2013.01); *C08K 5/01* (2013.01); *C08L 33/08* (2013.01); *C08L 33/24* (2013.01); *C08L 63/00* (2013.01); *C08L 67/00* (2013.01); *C08L 77/00* (2013.01); *C08L 2203/16* (2013.01); *C08L 2203/20* (2013.01)

(58) Field of Classification Search
CPC ..... C08L 71/12; C08L 71/126; C08G 65/485; C08F 212/36
See application file for complete search history.

(56) References Cited

U.S. PATENT DOCUMENTS

| 9,243,164 B1 * | 1/2016 | Almen | ...................... C08K 5/03 |
|---|---|---|---|
| 2017/0190837 A1 * | 7/2017 | Hsieh | .......................... C08J 5/10 |
| 2019/0016874 A1 * | 1/2019 | Hsieh | ...................... C08L 75/14 |
| 2020/0199329 A1 * | 6/2020 | Hu | ....................... H05K 1/0373 |

FOREIGN PATENT DOCUMENTS

JP 2010111758 A * 5/2010

OTHER PUBLICATIONS

Machine translation of JP 2010111758 A.*

* cited by examiner

*Primary Examiner* — Kregg T Brooks
(74) *Attorney, Agent, or Firm* — Muncy, Geissler, Olds & Lowe, P.C.

(57) ABSTRACT

A resin composition comprises: a vinyl-containing polyphenylene ether resin, a bis(vinylphenyl)ethane and a modification of divinylbenzene. The resin composition may be used to make various articles, such as a prepreg, a resin film, a laminate or a printed circuit board, and achieves improvements in at least one of the properties including dielectric constant, dissipation factor, copper foil peeling strength, glass transition temperature, ratio of thermal expansion, thermal expansion coefficient, precipitation property of varnish, solder dipping thermal resistance, solder floating thermal resistance of multi-layer board, reflow thermal resistance of multi-layer board and T300 thermal resistance.

17 Claims, No Drawings

RESIN COMPOSITION AND ARTICLE MADE THEREFROM

CROSS-REFERENCE TO RELATED APPLICATION

This application claims the priority benefits of Taiwan Patent Application No. 108136851, filed on Oct. 14, 2019. The entirety the above-mentioned patent application is hereby incorporated by reference herein and made a part of this specification.

BACKGROUND

1. Field of the Disclosure

The present disclosure relates to a resin composition and more particularly to a resin composition useful for preparing a prepreg, a resin film, a laminate or a printed circuit board.

2. Description of Related Art

With the rapid advancement of electronic technology, information processing in mobile communication, servers, cloud storage and other electronic products has been incessantly directed toward high frequency signal transmission and high speed digitalization, and low dielectric resin material has become the mainstream for the development of laminates for high speed data transmission in order to satisfy the demands of high speed information transmission. The major requirements of resin materials and products thereof such as copper-clad laminates include several aspects such as low dissipation factor (Df), high reliability, high thermal resistance and high dimensional stability. Therefore, there is a need for developing materials suitable for a printed circuit board (PCB) with overall better performances.

SUMMARY

To overcome the problems of prior arts, particularly one or more above-mentioned technical problems facing conventional materials, it is a primary object of the present disclosure to provide a resin composition and an article made therefrom which may overcome at least one of the above-mentioned technical problems.

Generally, laminate materials made from conventional epoxy resin materials are unable to achieve a dissipation factor measured at 10 GHz of less than 0.0040.

On the other hand, it is possible for laminate materials made from polyphenylene ether resin materials to achieve a dissipation factor measured at 10 GHz of less than 0.0040. However, in addition to dissipation factor, several properties are also desired for an ideal low dielectric laminate material, such as high glass transition temperature (such as greater than or equal to 200° C.), high copper foil peeling strength (such as greater than or equal to 3.00 lb/in), low ratio of thermal expansion (such as less than or equal to 2.50%), low thermal expansion coefficient (a.k.a. coefficient of thermal expansion (CTE), such as less than or equal to 55 ppm/° C.), high solder dipping thermal resistance, etc. In addition, while it is possible for laminate materials made from some polyphenylene ether resin materials to achieve a dissipation factor measured at 10 GHz of less than 0.0040, these laminate materials tend to have poor thermal resistance and therefore may cause product failure due to blistering or delamination during the fabrication of multi-layer circuit boards.

To achieve the above-mentioned objects, the present disclosure provides a resin composition, comprising: a vinyl-containing polyphenylene ether resin, a bis(vinylphenyl)ethane and a modification of divinylbenzene.

In one embodiment, the vinyl-containing polyphenylene ether resin comprises a vinylbenzyl-containing polyphenylene ether resin, a methacrylate-containing polyphenylene ether resin, an allyl-containing polyphenylene ether resin, a vinylbenzyl-modified bisphenol A polyphenylene ether resin, a chain-extended vinyl-containing polyphenylene ether resin or a combination thereof.

For example, in one embodiment, the vinyl-containing polyphenylene ether resin comprises a methacrylate-containing polyphenylene ether resin. In another embodiment, the vinyl-containing polyphenylene ether resin comprises a vinylbenzyl-containing polyphenylene ether resin. In still another embodiment, the vinyl-containing polyphenylene ether resin comprises a vinylbenzyl-containing polyphenylene ether resin and a methacrylate-containing polyphenylene ether resin, and the ratio of both resins is not limited.

Unless otherwise specified, the vinyl-containing polyphenylene ether resin is construed as including its modification. Examples of the modification described above may comprise, but not limited to, a product derived from a vinyl-containing polyphenylene ether resin with its reactive functional group modified, a product derived from a prepolymerization reaction of a vinyl-containing polyphenylene ether resin and other resins, a product derived from a crosslinking reaction of a vinyl-containing polyphenylene ether resin and other resins, a product derived from homopolymerizing a vinyl-containing polyphenylene ether resin, a product derived from copolymerizing a vinyl-containing polyphenylene ether resin and another different vinyl-containing polyphenylene ether resin, etc.

In one embodiment, the bis(vinylphenyl)ethane may include 1,2-bis(4-vinylphenyl)ethane, 1,2-(3-vinylphenyl-4-vinylphenyl)ethane, 1,2-bis(3-vinylphenyl) ethane or a combination thereof.

Unless otherwise specified, the modification of divinylbenzene is construed as including any modification derived from divinylbenzene (such as 1,4-divinylbenzene, 1,3-divinylbenzene or a combination thereof), including but not limited to a divinylbenzene copolymer, a divinylbenzene prepolymer, a divinylbenzene derivative or a combination thereof. Examples include but are not limited to a copolymer, a prepolymer or a derivative of divinylbenzene and a following component: methyl methacrylate resin, triallyl isocyanurate resin, triallyl cyanurate resin, ethylstyrene or a combination thereof.

For example, the divinylbenzene prepolymer is, such as but not limited to, a prepolymer of divinylbenzene and at least one another compound, such as but not limited to a prepolymer of divinylbenzene, methyl methacrylate resin and triallyl isocyanurate resin. For example, the divinylbenzene copolymer is, such as but not limited to a copolymer of divinylbenzene and at least one another compound, such as but not limited to a copolymer of divinylbenzene and ethylstyrene.

In one embodiment, the resin composition may further optionally comprise: a maleimide resin, a small molecule vinyl compound, an acrylate, an epoxy resin, a cyanate ester resin, a phenolic resin, a benzoxazine resin, a styrene maleic anhydride, a polyolefin, a polyester resin, an amine curing agent, a polyamide resin, a polyimide resin or a combination thereof.

For example, the maleimide resin comprises a maleimide resin containing aliphatic long-chain structure.

In one embodiment, the resin composition may further optionally comprise: flame retardant, inorganic filler, curing accelerator, polymerization inhibitor, solvent, silane coupling agent, coloring agent, toughening agent or a combination thereof.

With the proviso that various objects of the present disclosure can be met, the content of each component in the resin composition according to the present disclosure may be adjusted as needed, such as according to the properties of the articles made therefrom.

In one embodiment, the resin composition comprises 50 parts by weight of the vinyl-containing polyphenylene ether resin, 5 to 40 parts by weight of the bis(vinylphenyl)ethane and 2 to 20 parts by weight of the modification of divinylbenzene.

In one embodiment, the resin composition comprises 50 parts by weight of the vinyl-containing polyphenylene ether resin, 10 to 30 parts by weight of the bis(vinylphenyl)ethane and 5 to 15 parts by weight of the modification of divinylbenzene.

In one embodiment, after a varnish prepared from the resin composition is stood at a predetermined temperature (such as 5° C. to 35° C.) for a period of time (such as 24 hours), no precipitation is observed from the varnish by visual inspection (such as the varnish does not form precipitate such as but not limited to white precipitate).

Another main object of the present disclosure is to provide an article made from the aforesaid resin composition, comprising a prepreg, a resin film, a laminate or a printed circuit board.

In one embodiment, articles made from the resin composition disclosed herein have one, more or all of the following properties:

a dielectric constant at 10 GHz as measured by reference to JIS C2565 of less than or equal to 3.15;
a dissipation factor at 10 GHz as measured by reference to JIS C2565 of less than or equal to 0.0020;
a copper foil peeling strength as measured by reference to IPC-TM-650 2.4.8 of greater than or equal to 3.00 lb/in;
a glass transition temperature as measured by reference to IPC-TM-650 2.4.24.4 of greater than or equal to 200° C.;
a ratio of thermal expansion as measured by reference to IPC-TM-650 2.4.24.5 of less than or equal to 2.50%;
a thermal expansion coefficient as measured by reference to IPC-TM-650 2.4.24.5 of less than or equal to 55 ppm/° C.;
no delamination occurs after subjecting the article to a solder dipping thermal resistance test of more than 20 cycles by reference to IPC-TM-650 2.4.23;
no delamination occurs after subjecting the article to a solder floating thermal resistance test of multi-layer board of 20 cycles by reference to IPC-TM-650 2.4.13.1;
no delamination occurs after subjecting the article to a 260° C. reflow thermal resistance test of multi-layer board of 10 cycles by reference to IPC-TM-650 2.6.27; and
having a T300 thermal resistance as measured by reference to IPC-TM-650 2.4.24.1 of greater than 75 minutes.

For example, articles made from the resin composition according to the present disclosure can pass the varnish precipitation test without forming precipitation and satisfy at the same time at least six, seven, eight, nine or ten properties described above, including but not limited to dielectric constant, ratio of thermal expansion or thermal expansion coefficient. For example, even if articles made from the resin composition according to the present disclosure fail in the varnish precipitation test, they can still satisfy at least seven, eight, nine or ten properties described above.

DESCRIPTION OF THE EMBODIMENTS

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

As used herein, the term "comprises," "comprising," "includes," "including," "has," "having" or any other variant thereof is construed as an open-ended transitional phrase intended to cover a non-exclusive inclusion. For example, a composition or article of manufacture that comprises a list of elements is not necessarily limited to only those elements but may include other elements not expressly listed but inherent to such composition or article of manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "has," "having" or any other variant thereof, it is understood that transitional phrases such as "consisting essentially of" and "consisting of" are also disclosed and included.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Similarly, a range of "between 1 and 8" should be understood as explicitly disclosing all ranges such as 1 to 8, 1 to 7, 2 to 8, 2 to 6, 3 to 6, 4 to 8, 3 to 8 and so on and encompassing the end points of the ranges. Unless otherwise defined, the aforesaid interpretation rule should be applied throughout the present disclosure regardless broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$ and/or $X_3$. In addition, when a Markush group or a list of items is used to describe examples or embodiments of the present disclosure, a skilled artisan will understand that any subgroup or any combination of the members or items in the Markush group or list may also be used to describe the present disclosure. Therefore, when X is described as being "selected from a group consisting of $X_1$, $X_2$ and $X_3$," and Y is described as being "selected from a group consisting of $Y_1$, $Y_2$ and $Y_3$," the disclosure of any combination of X is $X_1$ and/or $X_2$ and/or $X_3$ and Y is $Y_1$ and/or $Y_2$ and/or $Y_3$.

The following embodiments and examples are illustrative in nature and are not intended to limit the present disclosure and its application. In addition, the present disclosure is not bound by any theory described in the background and summary above or the following embodiments or examples.

Unless otherwise specified, according to the present disclosure, a resin may include a compound and/or a mixture, a compound may include a monomer and/or a polymer, and a mixture may include two or more compounds and may also include a copolymer, a prepolymer, other auxiliaries or a combination thereof, but not limited thereto.

Unless otherwise specified, according to the present disclosure, a compound refers to a chemical substance formed by two or more elements bonded with chemical bonds and may be present as a monomer, a polymer, etc., but not limited thereto. A monomer refers to a compound which may participate in a polymerization or prepolymerization reaction to produce a high molecular weight compound. A homopolymer refers to a chemical substance formed by a single compound via polymerization, addition polymerization or condensation polymerization, and a copolymer refers to a chemical substance formed by two or more compounds via polymerization, addition polymerization or condensation polymerization, but not limited thereto. In addition, the term "polymer" includes but is not limited to an oligomer. An oligomer refers to a polymer with 2 to 20, typically 2 to 5, repeating units. A prepolymer refers to a chemical substance formed by two or more compounds via a polymerization reaction with a conversion rate of 10% to 90%.

As described above, the present disclosure primarily aims to provide a resin composition which comprises: a vinyl-containing polyphenylene ether resin, a bis(vinylphenyl) ethane and a modification of divinylbenzene.

According to the present disclosure, the vinyl-containing polyphenylene ether resin refers to a polyphenylene ether resin having an ethylenic carbon-carbon double bond (C=C) or a functional group derived therefrom, examples including but not limited to the presence of a vinyl group, an allyl group, a vinylbenzyl group, a methacrylate group or the like in the polyphenylene ether resin. Unless otherwise specified, the position of the aforesaid functional group is not particularly limited and may be located at the terminal of a long-chain structure. In other words, the vinyl-containing polyphenylene ether resin described herein represents a polyphenylene ether resin containing an ethylenic carbon-carbon double bond, examples including but not limited to a polyphenylene ether resin containing a vinyl group, an allyl group, a vinylbenzyl group, a methacrylate group or the like. For example, in one embodiment, the vinyl-containing polyphenylene ether resin comprises a methacrylate-containing polyphenylene ether resin. In another embodiment, the vinyl-containing polyphenylene ether resin comprises a vinylbenzyl-containing polyphenylene ether resin. In still another embodiment, the vinyl-containing polyphenylene ether resin contains at the same time two different polyphenylene ether resins containing an ethylenic carbon-carbon double bond (C=C) or a functional group derived therefrom, such as containing at the same time a vinylbenzyl-containing polyphenylene ether resin and a methacrylate-containing polyphenylene ether resin, wherein the content or ratio thereof is not particularly limited and may be adjusted as needed, such as using a weight ratio of between 1:99 and 99:1, such as 10:90, 20:80, 30:70, 40:60, 50:50, 60:40, 70:30, 80:20 or 90:10, but not limited thereto.

As used herein, unless otherwise specified, the vinyl-containing polyphenylene ether resin also encompasses its modification, and examples of the modification may comprise, but not limited to, a product derived from a vinyl-containing polyphenylene ether resin with its reactive functional group modified, a product derived from a prepolymerization reaction of a vinyl-containing polyphenylene ether resin and other resins, a product derived from a crosslinking reaction of a vinyl-containing polyphenylene ether resin and other resins, a product derived from homopolymerizing a vinyl-containing polyphenylene ether resin, a product derived from copolymerizing a vinyl-containing polyphenylene ether resin and another different vinyl-containing polyphenylene ether resin, etc.

In one embodiment, the vinyl-containing polyphenylene ether resin comprises a vinylbenzyl-containing polyphenylene ether resin, a methacrylate-containing polyphenylene ether resin, an allyl-containing polyphenylene ether resin, a vinylbenzyl-modified bisphenol A polyphenylene ether resin, a chain-extended vinyl-containing polyphenylene ether resin or a combination thereof.

For example, as used herein, examples of the vinyl-containing polyphenylene ether resin may include a vinylbenzyl-containing polyphenylene ether resin with a number average molecular weight of about 1200 (such as OPE-2st 1200, available from Mitsubishi Gas Chemical Co., Inc.), a vinylbenzyl-containing polyphenylene ether resin with a number average molecular weight of about 2200 (such as OPE-2st 2200, available from Mitsubishi Gas Chemical Co., Inc.), a methacrylate-containing polyphenylene ether resin with a number average molecular weight of about 1900 to 2300 (such as SA-9000, available from Sabic), a vinylbenzyl-modified bisphenol A polyphenylene ether resin with a number average molecular weight of about 2400 to 2800, a chain-extended vinyl-containing polyphenylene ether resin with a number average molecular weight of about 2200 to 3000, or a combination thereof. Examples of the chain-extended vinyl-containing polyphenylene ether resin may include various polyphenylene ether resins disclosed in the US Patent Application Publication No. 2016/0185904 A1, all of which are incorporated herein by reference in their entirety.

In addition, for example, in the present disclosure, the vinyl-containing polyphenylene ether resin may comprise a structure of Formula (A):

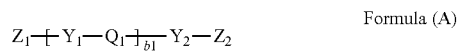

Formula (A)

wherein b1 is a natural number of 0 to 2;
$Q_1$ comprises a structure of any one of Formula (A-1) to Formula (A-3):

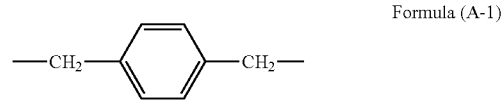

Formula (A-1)

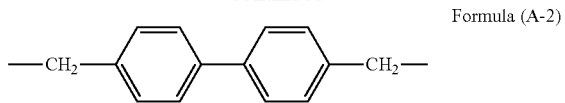
Formula (A-2)

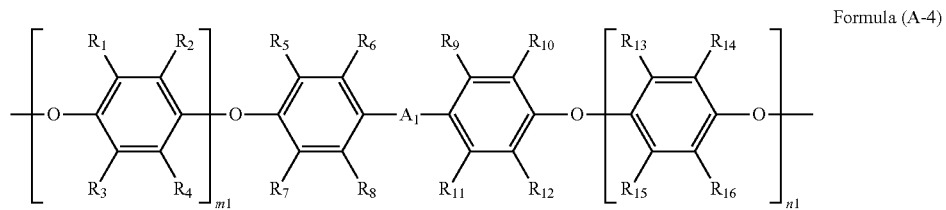
Formula (A-3)

$Y_1$ and $Y_2$ independently comprise a structure of Formula (A-4):

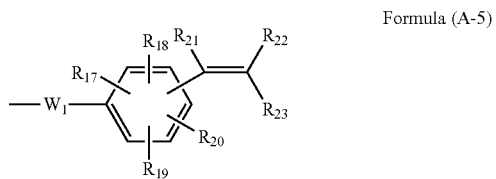
Formula (A-4)

In Formula (A-4), m1 and n1 independently represent an integer of 1 to 15, such as 1, 5, 10 or 15;

$R_1$ to $R_{16}$ are independently selected from H, —CH$_3$ and a halogen atom (e.g., chlorine, bromine, or iodine); $A_1$ is selected from a covalent bond, —CH$_2$—, —CH(CH$_3$)—, —C(CH$_3$)$_2$—, —O—, —S—, —SO$_2$— and a carbonyl group;

$Z_1$ and $Z_2$ independently comprise a structure of Formula (A-5):

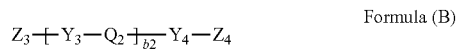
Formula (A-5)

In Formula (A-5), $R_{17}$ to $R_{23}$ are individually selected from H, —CH$_3$ or a halogen atom, and $W_1$ is a $C_1$-$C_3$ bivalent aliphatic group, such as methylene, ethylene, or propylene.

For example, in the present disclosure, the vinyl-containing polyphenylene ether resin may comprise a structure below:

wherein m3 and n3 independently represent an integer of 1 to 15; $R_{50}$ to $R_{65}$ are independently selected from H, —CH$_3$ and a halogen atom; and $A_3$ is selected from a covalent bond, —CH$_2$—, —CH(CH$_3$)—, —C(CH$_3$)$_2$—, —O—, —S—, —SO$_2$— and a carbonyl group.

In addition, for example, in the present disclosure, the vinyl-containing polyphenylene ether resin may comprise a structure of Formula (B):

$$Z_3\!\!-\!\!\left[\,Y_3\!-\!Q_2\,\right]_{b2}\!\!-\!\!Y_4\!-\!Z_4$$
Formula (B)

wherein b2 is a natural number of 0 to 8;

$Q_2$ comprises a structure of any one of Formula (B-1) to Formula (B-3) or a combination thereof:

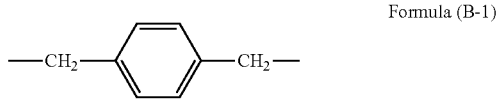
Formula (B-1)

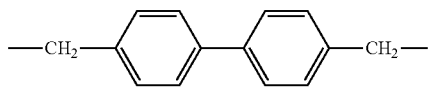
Formula (B-2)

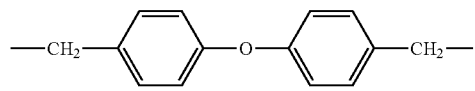
Formula (B-3)

$Y_3$ and $Y_4$ independently comprise a structure of Formula (B-4):

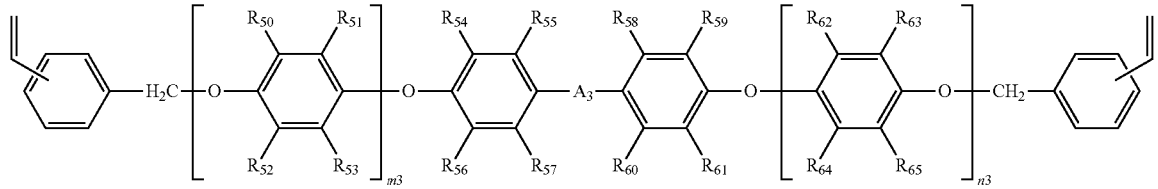

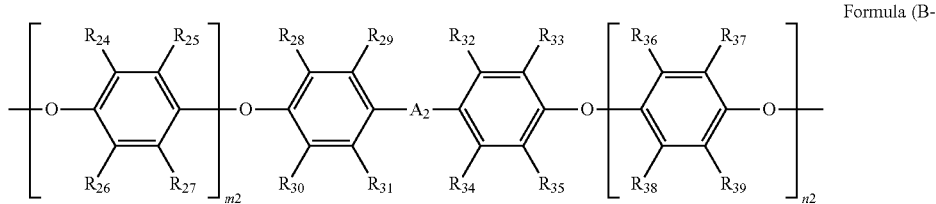

Formula (B-4)

wherein m2 and n2 independently represent an integer of 1 to 30, such as 1, 5, 10, 15, 20, 25 or 30; $R_{24}$ to $R_{39}$ are independently selected from H, —$CH_3$ and a halogen atom (e.g., chlorine, bromine, or iodine); $A_2$ is selected from a covalent bond, —$CH_2$—, —$CH(CH_3)$—, —$C(CH_3)_2$—, —O—, —S—, —$SO_2$— and a carbonyl group;
$Z_3$ and $Z_4$ independently comprise a structure of Formula (B-5), Formula (B-6) or Formula (B-7):

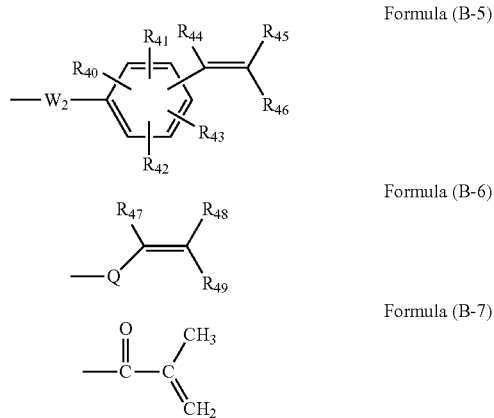

Formula (B-5)

Formula (B-6)

Formula (B-7)

wherein $R_{40}$ to $R_{49}$ are individually selected from H, —$CH_3$ or a halogen atom, and $W_2$ and Q are individually a $C_1$ to $C_3$ bivalent aliphatic group (e.g., methylene, ethylene, or propylene).

For example, according to the present disclosure, positions of the two vinyl groups of the bis(vinylphenyl)ethane are not particularly limited. In other words, according to the present disclosure, the bis(vinylphenyl)ethane is construed as comprising all structural isomers of the bis(vinylphenyl)ethane or a combination thereof, examples including 1,2-bis(4-vinylphenyl)ethane, 1,2-(3-vinylphenyl-4-vinylphenyl)ethane, 1,2-bis(3-vinylphenyl)ethane or a combination thereof.

For example, according to the present disclosure, the modification of divinylbenzene refers to various modifications derived from divinylbenzene, wherein the divinylbenzene may be 1,4-divinylbenzene, 1,3-divinylbenzene or a combination thereof. Moreover, the modification of divinylbenzene is construed to include various modifications formed by divinylbenzene together with at least one different compound and exclude a substance formed solely by divinylbenzene (such as homopolymer). For example, the amount of divinylbenzene and at least one different compound required for forming the modification of divinylbenzene is not particularly limited. For example, the weight ratio of divinylbenzene and at least one different compound required for forming the modification of divinylbenzene may be between 1:10 and 10:1, such as 1:9, 2:8, 3:7, 4:6, 5:5, 6:4, 7:3, 8:2 or 9:1, but not limited thereto.

Unless otherwise specified, the modification of divinylbenzene is construed as including but not limited to a divinylbenzene copolymer, a divinylbenzene prepolymer, a divinylbenzene derivative or a combination thereof. Examples include but are not limited to a copolymer, a prepolymer or a derivative of divinylbenzene and a following component: methyl methacrylate resin, triallyl isocyanurate resin, triallyl cyanurate resin, ethylstyrene or a combination thereof.

For example, the divinylbenzene prepolymer may be a prepolymer of divinylbenzene and at least one another compound, such as but not limited to a prepolymer of divinylbenzene, methyl methacrylate resin and triallyl isocyanurate resin. For example, the divinylbenzene copolymer may be a copolymer of divinylbenzene and at least one another compound, such as but not limited to a copolymer of divinylbenzene and ethylstyrene.

With the proviso that various objects of the present disclosure can be met, the content of each component in the resin composition according to the present disclosure may be adjusted as needed, such as according to the properties of the articles made therefrom.

For example, the amount of each of the vinyl-containing polyphenylene ether resin, the bis(vinylphenyl)ethane and the modification of divinylbenzene can be adjusted as needed. For example, relative to 50 parts by weight of the vinyl-containing polyphenylene ether resin, the resin composition of the present disclosure may contain such as 5, 10, 15, 20, 25, 30, 35 or 40 parts by weight of the bis(vinylphenyl)ethane. For example, relative to 50 parts by weight of the vinyl-containing polyphenylene ether resin, the resin composition of the present disclosure may contain such as 2, 5, 10, 12, 15 or 20 parts by weight of the modification of divinylbenzene.

In one embodiment, the resin composition comprises 50 parts by weight of the vinyl-containing polyphenylene ether resin, 5 to 40 parts by weight of the bis(vinylphenyl)ethane and 2 to 20 parts by weight of the modification of divinylbenzene.

In one embodiment, the resin composition comprises 50 parts by weight of the vinyl-containing polyphenylene ether resin, 10 to 30 parts by weight of the bis(vinylphenyl)ethane and 5 to 15 parts by weight of the modification of divinylbenzene.

In one embodiment, the resin composition disclosed herein may further optionally comprise: a maleimide resin, a small molecule vinyl compound, an acrylate, an epoxy resin, a cyanate ester resin, a phenolic resin, a benzoxazine resin, a styrene maleic anhydride, a polyolefin, a polyester resin, an amine curing agent, a polyamide resin, a polyimide resin or a combination thereof. The amount of each component described above may be adjusted as needed; for example, relative to 50 parts by weight of the vinyl-containing polyphenylene ether resin, the amount of each component described above may independently be between 0.1 part by weight and 100 parts by weight, preferably between 0.1 part by weight and 50 parts by weight, but not limited thereto.

For example, the maleimide resin may refer to a compound or a mixture containing at least one maleimide group. Unless otherwise specified, the maleimide resin used in the present disclosure is not particularly limited and may include any one or more maleimide resins useful for making a prepreg, a resin film, a laminate or a printed circuit board. Examples include but are not limited to 4,4'-diphenylmethane bismaleimide, oligomer of phenylmethane maleimide (a.k.a. polyphenylmethane maleimide), bismaleimide toluene, diethylbismaleimide toluene, m-phenylene bismaleimide, bisphenol A diphenyl ether bismaleimide, 3,3'-dimethyl-5,5'-diethyl-4,4'-diphenyl methane bismaleimide, 4-methyl-1,3-phenylene bismaleimide, 1,6-bismaleimide-(2,2,4-trimethyl)hexane, N-2,3-xylylmaleimide, N-2,6-xylylmaleimide, N-phenyl maleimide, a maleimide resin containing aliphatic long-chain structure, or a combination thereof. Preferably, the maleimide resin is a maleimide resin containing aliphatic long-chain structure. In addition, unless otherwise specified, the aforesaid maleimide resin of the present disclosure may comprise a prepolymer thereof, such as a prepolymer of diallyl compound and maleimide compound, a prepolymer of diamine and maleimide compound, a prepolymer of multi-functional amine and maleimide compound or a prepolymer of acid phenol compound and maleimide compound, but not limited thereto.

For example, the maleimide resin may include products such as BMI-1000, BMI-1000H, BMI-1100, BMI-1100H, BMI-2000, BMI-2300, BMI-3000, BMI-3000H, BMI-4000, BMI-4000H, BMI-5000, BMI-5100, BM-7000 and BMI-7000H available from Daiwakasei Co., Ltd., products such as BMI-70 and BMI-80 available from K.I Chemical Industry Co., Ltd., or products such as Compimide MDAB, Compimide TDAB, and Compimide DE-TDAB available from Evonik Industries.

For example, the maleimide resin containing aliphatic long-chain structure may include products such as BMI-689, BMI-1400, BMI-1500, BMI-1700, BMI-2500, BMI-3000, BMI-3000J, BMI-3000G, BMI-3000GE, BMI-5000 and BMI-6000 available from Designer Molecules Inc. For example, relative to 50 parts by weight of the vinyl-containing polyphenylene ether resin, the amount of the maleimide resin containing aliphatic long-chain structure may be between 2 parts by weight and 30 parts by weight, but not limited thereto.

For example, the small molecule vinyl compound as used herein refers to a vinyl-containing compound with a molecular weight of less than or equal to 1000, preferably between 100 and 900 and more preferably between 100 and 800. According to the present disclosure, the small molecule vinyl compound may include, but not limited to, bis(vinylbenzyl) ether (BVBE), triallyl isocyanurate (TAIC), triallyl cyanurate (TAC), 1,2,4-trivinyl cyclohexane (TVCH) or a combination thereof. For example, relative to 50 parts by weight of the vinyl-containing polyphenylene ether resin, the amount of the small molecule vinyl compound may be between 5 parts by weight and 25 parts by weight, but not limited thereto.

For example, the acrylate may include, but not limited to, tricyclodecane di(meth)acrylate, tri(meth)acrylate, 1,1'-[(octahydro-4,7-methano-1H-indene-5,6-diyl) bis(methylene)] ester (e.g., SR833S, available from Sartomer) or a combination thereof.

For example, the epoxy resin may be any epoxy resins known in the field to which this disclosure pertains, including but not limited to bisphenol A epoxy resin, bisphenol F epoxy resin, bisphenol S epoxy resin, bisphenol AD epoxy resin, phenol novolac epoxy resin, trifunctional epoxy resin, tetrafunctional epoxy resin, multifunctional novolac epoxy resin, dicyclopentadiene (DCPD) epoxy resin, phosphorus-containing epoxy resin, p-xylene epoxy resin, naphthalene epoxy resin (e.g., naphthol epoxy resin), benzofuran epoxy resin, isocyanate-modified epoxy resin, or a combination thereof. The phenol novolac epoxy resin may be bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin, wherein the phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may be any one or more selected from DOPO-containing phenolic novolac epoxy resin, DOPO-containing cresol novolac epoxy resin and DOPO-containing bisphenol-A novolac epoxy resin; the DOPO-HQ epoxy resin may be any one or more selected from DOPO-HQ-containing phenolic novolac epoxy resin, DOPO-HQ-containing cresol novolac epoxy resin and DOPO-HQ-containing bisphenol-A novolac epoxy resin.

For example, the cyanate ester resin may include any one or more cyanate ester resins useful for preparing a prepreg, a resin film, a laminate or a printed circuit board, such as a compound having an Ar—O—C≡N structure, wherein Ar may be a substituted or unsubstituted aromatic group. Examples include but are not limited to novolac cyanate ester resin, bisphenol A cyanate ester resin, bisphenol F cyanate ester resin, dicyclopentadiene-containing cyanate ester resin, naphthalene-containing cyanate ester resin, phenolphthalein cyanate ester resin, adamantane cyanate ester resin, fluorene cyanate ester resin or a combination thereof. The novolac cyanate ester resin may be bisphenol A novolac cyanate ester resin, bisphenol F novolac cyanate ester resin or a combination thereof. For example, the cyanate ester resin may be available under the tradename Primaset PT-15, PT-30S, PT-60S, BA-200, BA-230S, BA-3000S, BTP-2500, BTP-6020S, DT-4000, DT-7000, ULL950S, HTL-300, CE-320, LVT-50, or LeCy sold by Lonza.

For example, the phenolic resin may comprise but not limited to mono-functional, bifunctional or multifunctional phenolic resin, comprising phenolic resin of a resin composition conventionally used for making prepregs, such as phenoxy resin, phenol novolac resin, etc.

For example, the benzoxazine resin includes, but not limited to, bisphenol A benzoxazine resin, bisphenol F benzoxazine resin, phenolphthalein benzoxazine resin, dicyclopentadiene benzoxazine resin, phosphorus-containing benzoxazine resin, oxydianiline benzoxazine resin, or unsaturated bond-containing benzoxazine resin, such as but not limited to LZ-8270, LZ-8280, LZ-8290 or LZ-8298 available from Huntsman, HFB-2006M available from Showa High Polymer, or KZH-5031 available from Kolon Industries Inc.

For example, in the styrene maleic anhydride, the ratio of styrene (S) to maleic anhydride (MA) may be for example 1/1, 2/1, 3/1, 4/1, 6/1, 8/1 or 12/1, examples including styrene maleic anhydride copolymers such as SMA-1000, SMA-2000, SMA-3000, EF-30, EF-40, EF-60 and EF-80 available from Cray Valley, or styrene maleic anhydride copolymers such as C400, C500, C700 and C900 available from Polyscope.

Unless otherwise specified, the polyolefin also includes its modification. For example, examples of the polyolefin include but are not limited to styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, hydrogenated styrene-butadiene-divinylbenzene terpolymer, polybutadiene (homopolymer of butadiene), maleic anhydride-butadiene copolymer, methyl styrene copolymer, hydroxyl-terminated hydrogenated polybutadiene, vinyl-modified hydroxyl-terminated hydrogenated polybutadiene (not containing hydroxyl group) or a combination thereof. In a preferred embodiment, the polyolefin comprises a vinyl-modified hydroxyl-terminated hydrogenated polybutadiene.

For example, the polyester resin may be prepared by esterification of dicarboxylic aromatic compounds with dihydroxyl aromatic compounds. Examples of the polyester resin include, but not limited to, HPC-8000, HPC-8150 or HPC-8200 available from D.I.C. Corporation.

For example, the amine curing agent may include, but not limited to, any one or a combination of diamino diphenyl sulfone, diamino diphenyl methane, diamino diphenyl ether, diamino diphenyl sulfide and dicyandiamide.

For example, the polyamide resin may be any polyamide resin known in the field to which this disclosure pertains, including but not limited to various commercially available polyamide resin products.

For example, the polyimide resin may be any polyimide resin known in the field to which this disclosure pertains, including but not limited to various commercially available polyimide resin products.

In one embodiment, the resin composition disclosed herein may optionally further comprise: flame retardant, inorganic filler, curing accelerator, polymerization inhibitor, solvent, silane coupling agent, coloring agent, toughening agent or a combination thereof. Unless otherwise specified, the amount of different above-mentioned additives used in the resin composition may be adjusted according to needs by a person of ordinary skill in the art.

For example, the flame retardant used herein may be any one or more flame retardants useful for preparing a prepreg, a resin film, a laminate or a printed circuit board, examples including but not limited to a phosphorus-containing flame retardant, preferably comprising ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives or resins, DPPO (diphenylphosphine oxide) and its derivatives or resins, melamine cyanurate, tri-hydroxy ethyl isocyanurate, aluminium phosphate (e.g., commercially available OP-930 and OP-935), and a combination thereof.

For example, the flame retardant may be a DPPO compound (e.g., di-DPPO compound), a DOPO compound (e.g., di-DOPO compound), a DOPO resin (e.g., DOPO-HQ, DOPO-NQ, DOPO-PN, and DOPO-BPN) and a DOPO-containing epoxy resin, wherein DOPO-PN is a DOPO phenol novolac compound, and DOPO-BPN may be a DOPO-containing bisphenol novolac compound, such as DOPO-BPAN (DOPO-bisphenol A novolac), DOPO-BPFN (DOPO-bisphenol F novolac) or DOPO-BPSN (DOPO-bisphenol S novolac).

For example, the inorganic filler may be any one or more inorganic fillers used for preparing a prepreg, a resin film, a laminate or a printed circuit board; examples of the inorganic filler include but are not limited to silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, silicon nitride, titanium dioxide, zinc oxide, zirconium oxide, mica, boehmite (AlOOH), calcined talc, talc, silicon nitride and calcined kaolin. Moreover, the inorganic filler can be spherical, fibrous, plate-like, particulate, sheet-like or whisker-like in shape and can be optionally pretreated by a silane coupling agent.

For example, the curing accelerator (including curing initiator) may comprise a catalyst, such as a Lewis base or a Lewis acid. The Lewis base may comprise any one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). The Lewis acid may comprise metal salt compounds, such as those of manganese, iron, cobalt, nickel, copper and zinc, such as zinc octanoate or cobalt octanoate. The curing accelerator also includes a curing initiator, such as a peroxide capable of producing free radicals, examples of curing initiator including but not limited to dicumyl peroxide, tert-butyl peroxybenzoate, dibenzoyl peroxide (BPO), 2,5-dimethyl-2,5-di(tert-butylperoxy)-3-hexyne (25B), bis(tert-butylperoxyisopropyl)benzene or a combination thereof.

For example, the polymerization inhibitor is not particularly limited and may be any polymerization inhibitor known in the field to which this disclosure pertains, including but not limited to various commercially available polymerization inhibitor products.

For example, the solvent is not particularly limited and may be any solvent suitable for dissolving the resin composition disclosed herein, example including, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof. In one embodiment, after being dissolved in a solvent, the resin composition of the present disclosure has the advantage of high solubility; for example, in the presence of a solvent, resins of the resin composition may be fully dissolved at 5° C. to 35° C. (i.e., the result of the resin solubility test is "clear") without forming precipitate.

For example, in one embodiment, after a varnish prepared from the resin composition is stood at a predetermined temperature (such as 5° C. to 35° C.) for a period of time (such as 24 hours), no precipitation is observed from the varnish by visual inspection (such as the varnish does not form precipitate such as but not limited to white precipitate).

For example, the silane coupling agent may comprise silane (such as but not limited to siloxane) and may be further categorized according to the functional groups into amino silane, epoxide silane, vinyl silane, acrylate silane, methacrylate silane, hydroxyl silane, isocyanate silane, methacryloxy silane and acryloxy silane.

For example, the coloring agent may comprise but not limited to dye or pigment.

As used herein, the purpose of adding toughening agent is to improve the toughness of the resin composition. For example, the toughening agent may comprise, but not limited to, carboxyl-terminated butadiene acrylonitrile rubber (CTBN rubber), core-shell rubber, or a combination thereof.

The resin compositions of various embodiments may be used for making different articles, including but not limited to a prepreg, a resin film, a laminate or a printed circuit board.

For example, the resin composition according to each of the various embodiments may be used to make a prepreg, which has a reinforcement material and a layered structure (e.g., insulation layer) formed thereon, wherein the layered structure is formed by heating the resin composition to a semi-cured state (B-Stage) at a high temperature for example between 120° C. and 160° C. For example, the reinforcement material may be any one of a fiber material, woven fabric, and non-woven fabric, and the woven fabric preferably comprises fiberglass fabrics. Types of fiberglass fabrics are not particularly limited and may be any commercial fiberglass fabric used for various printed circuit boards, such as E-glass fabric, D-glass fabric, S-glass fabric, T-glass fabric, L-glass fabric or Q-glass fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pre-treated by a silane coupling agent. The prepreg may be further heated and cured to the C-stage to form an insulation layer.

For example, the resin composition according to each of the various embodiments may be coated on a liquid crystal resin film, a polyester (PET) film, a polyimide (PI) film, a copper foil or a resin-coated copper (RCC), followed by baking and heating to the semi-cured state (B-Stage) to obtain a resin film.

For example, resin compositions of various embodiments of the present disclosure may be made into a laminate, such as a copper-clad laminate, which comprises two copper foils and an insulation layer disposed between the copper foils, wherein the insulation layer is formed by curing the resin compositions at high temperature and high pressure, a suitable curing temperature being for example between 190° C. and 220° C. and preferably between 200° C. and 215° C. and a suitable curing time being 90 to 180 minutes and preferably 110 to 150 minutes. The insulation layer may be obtained by curing the aforesaid prepreg or resin film. In one preferred embodiment, the laminate is a copper-clad laminate.

In one embodiment, the laminate may be further processed by trace formation processes to provide a printed circuit board.

Articles made from the resin composition according to the present disclosure have one or more preferred properties including low dielectric constant, low dissipation factor, high copper foil peeling strength, high glass transition temperature, low ratio of thermal expansion, low thermal expansion coefficient, high solder dipping thermal resistance, high solder floating thermal resistance, high reflow thermal resistance and high T300 thermal resistance, etc.

For example, the resin composition according to the present disclosure may achieve one, more or all of the following properties:
  a dielectric constant at 10 GHz as measured by reference to JIS C2565 of less than or equal to 3.15, such as between 3.01 and 3.15;
  a dissipation factor at 10 GHz as measured by reference to JIS C2565 of less than or equal to 0.0020, such as between 0.0017 and 0.0020;
  a copper foil peeling strength as measured by reference to IPC-TM-650 2.4.8 of greater than or equal to 3.00 lb/in, such as between 3.01 lb/in and 3.55 lb/in;
  a glass transition temperature as measured by reference to IPC-TM-650 2.4.24.4 of greater than or equal to 200° C., such as between 202° C. and 255° C. or such as between 210° C. and 255° C.;
  a ratio of thermal expansion as measured by reference to IPC-TM-650 2.4.24.5 of less than or equal to 2.50%, such as between 2.09% and 2.49%;
  a thermal expansion coefficient as measured by reference to IPC-TM-650 2.4.24.5 of less than or equal to 55 ppm/° C., such as between 35 ppm/° C. and 55 ppm/° C.;
  no delamination occurs after subjecting the article to a solder dipping thermal resistance test of more than 20 cycles by reference to IPC-TM-650 2.4.23, such as no delamination occurs after 20 to 30 cycles;
  no delamination occurs after subjecting the article to a solder floating thermal resistance test of multi-layer board of 20 cycles by reference to IPC-TM-650 2.4.13.1, such as no delamination occurs after subjecting three specimens to a solder floating thermal resistance test of multi-layer board of 20 cycles, so that the pass rate without delamination after 20 cycles of the solder floating thermal resistance test of multi-layer board is 100%;
  no delamination occurs after subjecting the article to a 260° C. reflow thermal resistance test of multi-layer board of 10 cycles by reference to IPC-TM-650 2.6.27, such as no delamination occurs after subjecting three specimens to a 260° C. reflow thermal resistance test of multi-layer board of 10 cycles, so that the pass rate without delamination after 10 cycles of the 260° C. reflow thermal resistance test of multi-layer board is 100%;
  a T300 thermal resistance as measured by reference to IPC-TM-650 2.4.24.1 of greater than 75 minutes, such as between 75 minutes and 120 minutes, or such as greater than 100 minutes, or such as between 100 minutes and 120 minutes; and
  after a varnish prepared from the resin composition is stood at 5° C. to 35° C., no precipitation is observed by visual inspection, such as no precipitation is observed by visual inspection from the varnish at 5° C.

Materials and reagents used in Examples and Comparative Examples disclosed herein are listed below:
  SA-9000: methacrylate-containing polyphenylene ether resin, available from Sabic.
  OPE-2st: OPE-2st 2200, vinylbenzyl-containing polyphenylene ether resin, available from Mitsubishi Gas Chemical Co., Inc.
  1,2-Bis(4-vinylphenyl)ethane: available from Linchuan Chemical Co., Ltd.
  Modification of divinylbenzene A: prepared according to Synthesis Example 1.

Modification of divinylbenzene B: prepared according to Synthesis Example 2.

1,4-Divinylbenzene: available from Merck.

Triallyl isocyanurate resin: TAIC, available from Kingyorker Enterprise Co., Ltd.

Methyl methacrylate resin: M55909, available from Merck.

4-Ethylstyrene: available from Alfa Chemistry.

BMI-3000: maleimide resin containing aliphatic long-chain structure, available from Designer Molecules Inc.

BMI-70: 3,3'-dimethyl-5,5'-diethyl-4,4'-diphenylmethane bismaleimide, available from K.I Chemical Industry Co., Ltd.

BMI-5100: bismaleimide resin, available from Daiwakasei Industry Co., Ltd.

Ricon 184MA6: styrene-butadiene-maleic anhydride terpolymer, available from Cray Valley.

Ricon 150: butadiene homopolymer, available from Cray Valley.

Ricon 100: styrene-butadiene copolymer, available from Cray Valley.

Vinyl-HLBH: vinyl-modified hydroxyl-terminated hydrogenated polybutadiene, as shown below, available from Cray Valley.

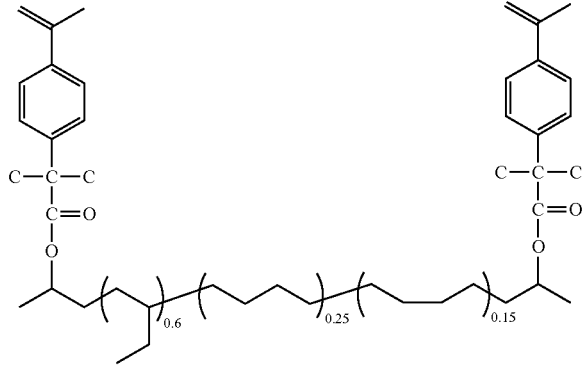

KBM-1003: vinyl siloxane coupling agent, available from Shin-Etsu Chemical Co., Ltd.

SC-2500-SVJ: spherical silica pre-treated by silane coupling agent, available from Admatechs.

25B: 2,5-dimethyl-2,5-di(t-butylperoxy)-3-hexyne, available from NOF Corporation.

Mixture of toluene and methyl ethyl ketone (weight ratio of 2:1): prepared by Applicant, wherein the toluene is available from Chambeco Group and the methyl ethyl ketone is commercially available.

Synthesis Example 1: Preparation of Modification of Divinylbenzene A

To 100 parts by weight of a toluene solvent, 20 parts by weight of 1,4-divinylbenzene was added and stirred to dissolve, followed by adding 10 parts by weight of methyl methacrylate resin (M55909) and 70 parts by weight of triallyl isocyanurate resin (TAIC), and adding 0.1 to 1.0 part by weight of peroxide (25B) as an initiator, and the reaction was performed under continuous stirring at 60° C. to 120° C. for 1 to 2 hours. After the reaction was completed, the product was filtered, purified and precipitated with methanol and cooled to obtain the modification of divinylbenzene A in solid state, which was a divinylbenzene prepolymer.

Synthesis Example 2: Preparation of Modification of Divinylbenzene B

To 100 parts by weight of a toluene solvent, 60 parts by weight of 1,4-divinylbenzene and 40 parts by weight of 4-ethylstyrene were added, followed by adding 2.0 parts by weight of tetrabutylammonium and 1.0 part by weight of stannic chloride, and the reaction was performed under continuous stirring at 60° C. to 120° C. for 1 to 4 hours. After the reaction was completed, the product was filtered, purified and precipitated with methanol and cooled to obtain the modification of divinylbenzene B in solid state, which was a divinylbenzene copolymer.

Samples (specimens) were prepared as described below and tested and analyzed under specified conditions below.

1. Prepreg: Resin composition from each Example or each Comparative Example (in part by weight) was separately added to a stirred tank and well mixed to form a varnish, wherein the "proper amount" of the mixture of toluene and methyl ethyl ketone (weight ratio of 2:1) as the solvent refers to an amount of the solvent mixture capable of resulting in a solid content of 60% of the resin composition in the varnish. Then the varnish was loaded to an impregnation tank; a fiberglass fabric (e.g., 2116 and 1080 L-glass fiber fabric, available from Asahi) was impregnated into the impregnation tank to adhere the resin composition onto the fiberglass fabric, followed by heating and baking at 140° C. for about 4 minutes to obtain a prepreg.

2. Copper-containing laminate (a.k.a. copper-clad laminate, 8-ply, formed by lamination of eight prepregs): Two 18 m HVLP (hyper very low profile) copper foils and eight prepregs obtained from 2116 L-glass fiber fabrics impregnated with each Example or each Comparative Example and having a resin content of about 55% were prepared and stacked in the order of one copper foil, eight prepregs and one copper foil, followed by lamination under vacuum at 30 kgf/cm$^2$ and 210° C. for 180 minutes to form a copper-containing laminate. Insulation layers were formed by laminating eight sheets of prepreg between the two copper foils, and the resin content of the insulation layers is about 55%.

3. Copper-containing laminate (a.k.a. copper-clad laminate, 2-ply, formed by lamination of two prepregs): Two 18 m HVLP (hyper very low profile) copper foils and two prepregs obtained from 1080 L-glass fiber fabrics impregnated with each Example or each Comparative Example and having a resin content of about 70% were prepared and stacked in the order of one copper foil, two prepregs and one copper foil, followed by lamination under vacuum at 30 kgf/cm$^2$ and 210° C. for 180 minutes to form a copper-containing laminate. Insulation layers were formed by laminating two sheets of prepreg between the two copper foils, and the resin content of the insulation layers is about 70%.

4. Copper-free laminate (8-ply, formed by lamination of eight prepregs): Each aforesaid copper-containing laminate (8-ply) was etched to remove the two copper foils to obtain a copper-free laminate (8-ply) formed by laminating eight sheets of prepreg and having a resin content of about 55%.

5. Copper-free laminate (2-ply, formed by lamination of two prepregs): Each aforesaid copper-containing laminate (2-ply) was etched to remove the two copper foils to obtain a copper-free laminate (2-ply) formed by laminating two sheets of prepreg and having a resin content of about 70%.

6. Copper-containing laminate for thermal resistance test of multi-layer board:

As far as the inventors are aware, for some conventional double-sided boards (such as double-sided copper-containing laminates made by stacking in the order of one copper foil, eight prepregs and one copper foil, followed by lamination under vacuum at high temperature and high pressure), although delamination is not observed when they are subjected to a solder floating thermal resistance test and a reflow thermal resistance test, materials made from these samples nevertheless cause delamination during the fabrication of multi-layer circuit boards. The reason, as observed by the inventors, is that conventional double-sided board samples involve the thermal resistance test between two or more prepregs, but the fabrication of multi-layer circuit boards involve lamination and adhesion between prepregs and a core; therefore, if the bonding strength after lamination between the prepregs and the adjacent core is insufficient, delamination may still occur during the fabrication of multi-layer circuit boards. Accordingly, results obtained from using conventional double-sided board samples in the solder floating thermal resistance test and the reflow thermal resistance test, even if the samples have passed the tests, are unable to ensure that no delamination will occur during the fabrication of multi-layer circuit boards. Therefore, as disclosed herein, a copper-containing laminate for thermal resistance test of multi-layer board was chosen by the inventors as the sample when conducting the solder floating thermal resistance test and the reflow thermal resistance test, so as to ensure that the sample conditions (lamination and adhesion between prepregs and core) are more in line with the fabrication of multi-layer circuit boards.

First, a core was prepared as follows: a prepreg (resin content of about 55%) prepared from each Example or each Comparative Example impregnated with a 2116 L-glass fiber fabric was superimposed on both sides with a piece of 18 m HVLP copper foil, followed by lamination and curing for 3 hours under vacuum at high temperature (210° C.) and high pressure (420 psi) to obtain a copper-clad core. Then the copper-clad core obtained above was etched to remove the copper foils on both sides so as to obtain a copper-free core (5 mil in thickness). Three copper-free cores were prepared as above. Next, two 18 m HVLP copper foils and four prepregs (resin content of about 70%) obtained from 1080 L-glass fiber fabrics impregnated with each Example or each Comparative Example were prepared and stacked in the order of one copper foil, two prepregs (obtained from 1080 L-glass fiber fabrics), one copper-free core, two prepregs (obtained from 1080 L-glass fiber fabrics), one copper-free core, two prepregs (obtained from 1080 L-glass fiber fabrics), and one copper foil, followed by lamination under vacuum at 420 psi and 200° C. for 2 hours to form a copper-clad laminate for thermal resistance test of multi-layer board (obtained by laminating eight prepregs).

For each sample, test items and test methods are described below.

Dielectric Constant (Dk)

The aforesaid copper-free laminate (obtained by laminating two prepregs, resin content of about 70%) was subject to dielectric constant measurement. Each sample was measured by using a microwave dielectrometer (available from AET Corp.) by reference to JIS C2565 at room temperature (about 25° C.) and under a 10 GHz frequency. Lower dielectric constant represents better dielectric properties of the sample. Under a 10 GHz frequency, for a Df value of less than 0.0040, a difference in Dk of less than 0.01 represents no substantial difference (i.e., no significant technical difficulty) in dielectric constant of different laminates, and a difference in Dk of greater than or equal to 0.01 represents a substantial difference in dielectric constant of different laminates.

Dissipation Factor (Df)

The aforesaid copper-free laminate (obtained by laminating two prepregs, resin content of about 70%) was subject to dissipation factor measurement. Each sample was measured by using a microwave dielectrometer (available from AET Corp.) by reference to JIS C2565 at room temperature (about 25° C.) and under a 10 GHz frequency. Lower dissipation factor represents better dielectric properties of the sample. Under a 10 GHz frequency, for a Df value of less than 0.0040, a difference in Df of less than 0.0001 represents no substantial difference (i.e., no significant technical difficulty) in dissipation factor of different laminates, and a difference in Df of greater than or equal to 0.0001 represents a substantial difference in dissipation factor of different laminates.

Copper Foil Peeling Strength (a.k.a. Peeling Strength, P/S)

The aforesaid copper-containing laminate (obtained by laminating eight prepregs) was cut into a rectangular sample with a width of 24 mm and a length of greater than 60 mm, which was etched to remove surface copper foil to leave a rectangular copper foil with a width of 3.18 mm and a length of greater than 60 mm, and tested by using a tensile strength tester by reference to IPC-TM-650 2.4.8 at room temperature (about 25° C.) to measure the force (lb/in) required to separate the copper foil from the insulation layer of the laminate. In the technical field to which the present disclosure pertains, higher copper foil peeling strength is better. Under a 10 GHz frequency, for a copper-clad laminate with a Df value of less than 0.0040, a difference in peeling strength of greater than or equal to 0.1 lb/in represents a substantial difference in copper foil peeling strength of different laminates.

Glass Transition Temperature (Tg)

A copper-free laminate sample (obtained by laminating eight prepregs) was subject to the glass transition temperature measurement. The glass transition temperature (in ° C.) of each sample was measured using a dynamic mechanical analysis (DMA) method by reference to IPC-TM-650 2.4.24.4 at a temperature range of 35° C. to 270° C. with a temperature increase rate of 2° C./minute. Higher glass transition temperature is better.

Ratio of Thermal Expansion

The copper-free laminate (obtained by laminating eight prepregs, resin content of about 55%) sample was subject to thermal mechanical analysis (TMA) during the ratio of thermal expansion (Z-axis) measurement. Each sample was heated from 35° C. to 270° C. at a temperature increase rate of 10° C./minute and then subject to the measurement of ratio of thermal expansion (%) in Z-axis from 50° C. to 260° C. by reference to the processes described in IPC-TM-650 2.4.24.5. Lower ratio of thermal expansion is better. Generally, a difference in ratio of thermal expansion of greater than or equal to 0.1% represents a substantial difference.

Thermal Expansion Coefficient (a.k.a. Coefficient of Thermal Expansion, CTE)

A copper-free laminate (obtained by laminating eight prepregs, resin content of about 55%) sample was subject to the measurement of thermal expansion coefficient (Z-axis). Each sample was heated from 35° C. to 270° C. at a temperature increase rate of 10° C./minute and then subject to the measurement of thermal expansion coefficient in Z-axis (al, in ppm/° C.) from 50° C. to 110° C. using the thermal mechanical analyzer (TMA) by reference to the processes described in IPC-TM-650 2.4.24.5. Lower thermal expansion coefficient is better. Generally, a difference in thermal expansion coefficient of greater than or equal to 0.1 ppm/° C. represents a substantial difference.

Precipitation Property of Varnish

At 25° C., all components, except for the inorganic filler (SC-2500-SVJ), of the resin composition for each Example or each Comparative Example were formulated to provide a varnish, and the varnish not containing the inorganic filler was well mixed and stirred for another 1 to 3 hours and then stood in a 5° C. refrigerator for a total of 24 hours. After that, the varnish was taken for visual inspection to determine whether precipitate was formed. If no precipitate was formed in the varnish, a designation of "N" was given; otherwise, if precipitate was observed in the varnish, such as but not limited to white precipitate, a designation of "Y" was given. Generally, poor precipitation property of varnish (i.e., formation of precipitate) will result in low uniformity in the properties of laminates and circuit boards from different batches and cause abnormality.

Solder Dipping Thermal Resistance (Solder Dipping, S/D)

In the solder dipping thermal resistance test, by reference to IPC-TM-650 2.4.23, the copper-containing laminate (obtained by laminating eight prepregs, resin content of about 55%) was immersed in a 288° C. solder bath for 10 seconds as one cycle, removed therefrom and placed under room temperature for about 10 seconds, and then re-immersed in the solder bath for 10 seconds, removed therefrom and placed under room temperature for about 10 seconds. The processes were repeated to measure the total cycles before the specimen occurred delamination; if no delamination was observed after the $20^{th}$ cycle, a designation of ">20" was given. Greater number of total cycles before delamination in the solder dipping test indicates that the copper-clad laminate specimen has better thermal resistance.

Solder Floating Thermal Resistance of Multi-Layer Board (Solder Floating)

The aforesaid copper-containing laminate for thermal resistance test of multi-layer board (obtained by laminating eight prepregs) was used in the solder floating thermal resistance test. The specimen was cut to a length of 20 cm and a width of 10 cm and, by reference to IPC-TM-650 2.4.13.1, horizontally placed and floated on the solder bath of a 288° C. solder pot; each process of 10 seconds of floating on the solder bath and then removing the specimen therefrom for 30 seconds of cooling represents one cycle, followed by subjecting the same specimen to another 10 seconds of floating on the solder bath and 30 seconds of cooling as the second cycle, and so on. The processes were repeated for a total of 20 cycles during the test. After 20 cycles, the specimen was sliced and then inspected with an optical microscope to determine the presence or absence of delamination. If no delamination was observed, a designation of "O" was given, and if delamination was observed, a designation of "X" was given; three specimens were tested for each Example or Comparative Example. In the test results, a designation with one "X" represents that delamination occurred in one specimen, a designation with two "X" represents that delamination occurred in two specimens, and a designation with three "X" represents that delamination occurred in all three specimens. Generally, interlayer separation between insulation layers of a specimen is considered as delamination, and interlayer separation may cause blistering and delamination between any layers of the laminate.

Reflow Thermal Resistance of Multi-Layer Board (Reflow)

The aforesaid copper-containing laminate for thermal resistance test of multi-layer board (obtained by laminating eight prepregs) was used in the reflow thermal resistance test. The specimen was cut to a length of 20 cm and a width of 10 cm and, by reference to IPC-TM-650 2.6.27, passed through a 260° C. reflow oven for a total of 10 cycles, and then sliced and inspected with an optical microscope to determine the presence or absence of delamination. If no delamination was observed, a designation of "O" was given, and if delamination was observed, a designation of "X" was given; three specimens were tested for each Example or Comparative Example. In the test results, a designation with one "X" represents that delamination occurred in one specimen, a designation with two "X" represents that delamination occurred in two specimens, and a designation with three "X" represents that delamination occurred in all three specimens. Generally, interlayer separation between insulation layers of a specimen is considered as delamination, and interlayer separation may cause blistering and delamination between any layers of the laminate.

T300 Thermal Resistance

The copper-containing laminate (obtained by laminating eight prepregs, resin content of about 55%) was used in the T300 thermal resistance test. At a constant temperature of 300° C., a thermomechanical analyzer (TMA) was used by reference to IPC-TM-650 2.4.24.1 "Time to Delamination (TMA Method)" to measure each specimen and record the time to delamination. If no delamination was observed at the $100^{th}$ minute, a designation of ">100" was given.

Compositions and test results of resin compositions of Examples and Comparative Examples are listed below (in part by weight). As used below in the Tables, "PA" refers to "proper amount".

TABLE 1

Resin compositions of Examples (in part by weight) and test results

| Component | Name | E1 | E2 | E3 | E4 | E5 | E6 |
|---|---|---|---|---|---|---|---|
| vinyl-containing polyphenylene ether resin | SA-9000 | 50 | 50 | 50 | 50 | 50 | 50 |
| | OPE-2st | | | | | | |
| bis(vinylphenyl)ethane | 1,2-bis(4-vinylphenyl)ethane | 30 | 10 | 30 | 30 | 30 | 30 |
| modification of divinylbenzene | A | 15 | 15 | 5 | 15 | 15 | 15 |
| | B | | | | | | |
| divinylbenzene | 1,4-divinylbenzene | | | | | | |
| triallyl isocyanurate resin | TAIC | | | | | | |
| methyl methacrylate resin | M55909 | | | | | | |
| ethylstyrene | 4-ethylstyrene | | | | | | |
| maleimide resin | BMI-3000 | | | | 2 | 5 | 10 |
| | BMI-70 | | | | | | |
| | BMI-5100 | | | | | | |

TABLE 1-continued

Resin compositions of Examples (in part by weight) and test results

| Component | Name | E1 | E2 | E3 | E4 | E5 | E6 |
|---|---|---|---|---|---|---|---|
| polyolefin | Ricon 184MA6 | | | | | | 2 |
| | Ricon 150 | | | | | | |
| | Ricon 100 | | | | | | |
| | vinyl-HLBH | | | | | | |
| silane coupling agent | KBM-1003 | | | | | | |
| inorganic filler | SC-2500-SVJ | 30 | 30 | 30 | 30 | 30 | 30 |
| peroxide | 25B | 0.2 | 0.2 | 0.2 | 0.2 | 0.2 | 0.2 |
| solvent | toluene/MEK = 2:1 | PA | PA | PA | PA | PA | PA |
| Property | Unit | E1 | E2 | E3 | E4 | E5 | E6 |
| Dk@10 GHz | — | 3.03 | 3.09 | 3.05 | 3.03 | 3.02 | 3.02 |
| Df@10 GHz | — | 0.0018 | 0.0019 | 0.0018 | 0.0018 | 0.0018 | 0.0017 |
| P/S | lb/in | 3.01 | 3.11 | 3.14 | 3.21 | 3.31 | 3.45 |
| Tg (DMA) | °C. | 228 | 210 | 233 | 225 | 218 | 212 |
| Z-axis ratio of thermal expansion | % | 2.11 | 2.40 | 2.21 | 2.15 | 2.36 | 2.49 |
| Z-axis thermal expansion coefficient | ppm/°C. | 35 | 48 | 45 | 40 | 45 | 51 |
| precipitation property of varnish | — | N | N | N | N | N | N |
| S/D | cycle | >20 | >20 | >20 | >20 | >20 | >20 |
| solder floating thermal resistance of multilayer board | — | ○○○ | ○○○ | ○○○ | ○○○ | ○○○ | ○○○ |
| reflow thermal resistance of multi-layer board | — | ○○○ | ○○○ | ○○○ | ○○○ | ○○○ | ○○○ |
| T300 thermal resistance | minute | >100 | >100 | >100 | >100 | >100 | >100 |

TABLE 2

Resin compositions of Examples (in part by weight) and test results

| Component | Name | E7 | E8 | E9 | E10 | E11 | E12 |
|---|---|---|---|---|---|---|---|
| vinyl-containing polyphenylene ether resin | SA-9000 | 50 | 50 | 50 | 50 | 50 | 50 |
| | OPE-2st | | | | | | |
| bis(vinylphenyl)ethane | 1,2-bis(4-vinylphenyl)ethane | 20 | 25 | 30 | 40 | 5 | 30 |
| modification of divinylbenzene | A | 10 | 12 | 7 | 15 | 15 | 2 |
| | B | | | 8 | | | |
| divinylbenzene | 1,4-divinylbenzene | | | | | | |
| triallyl isocyanurate resin | TAIC | | | | | | |
| methyl methacrylate resin | M55909 | | | | | | |
| ethylstyrene | 4-ethylstyrene | | | | | | |
| maleimide resin | BMI-3000 | 6 | 8 | 6 | 10 | 10 | 10 |
| | BMI-70 | | | | | | |
| | BMI-5100 | | | | | | |
| polyolefin | Ricon 184MA6 | 6 | | 4 | | | |
| | Ricon 150 | | | 3 | | | |
| | Ricon 100 | | | 3 | | | |
| | vinyl-HLBH | | 5 | 3 | | | |
| silane coupling agent | KBM-1003 | | 1 | 0.5 | | | |
| inorganic filler | SC-2500-SVJ | 30 | 30 | 40 | 30 | 30 | 30 |
| peroxide | 25B | 0.2 | 0.2 | 0.2 | 0.2 | 0.2 | 0.2 |
| solvent | toluene/MEK = 2:1 | PA | PA | PA | PA | PA | PA |
| Property | Unit | E7 | E8 | E9 | E10 | E11 | E12 |
| Dk@10 GHz | — | 3.06 | 3.03 | 3.03 | 3.01 | 3.09 | 3.08 |
| Df@10 GHz | — | 0.0019 | 0.0018 | 0.0017 | 0.0017 | 0.0019 | 0.0018 |
| P/S | lb/in | 3.37 | 3.24 | 3.55 | 3.06 | 3.16 | 3.31 |
| Tg (DMA) | °C. | 210 | 216 | 226 | 230 | 202 | 225 |
| Z-axis ratio of thermal expansion | % | 2.48 | 2.32 | 2.09 | 2.12 | 2.46 | 2.47 |
| Z-axis thermal expansion coefficient | ppm/°C. | 54 | 45 | 35 | 37 | 55 | 53 |
| precipitation property of varnish | — | N | N | N | N | N | Y |
| S/D | cycle | >20 | >20 | >20 | >20 | >20 | >20 |
| solder floating thermal resistance of multi-layer board | — | ○○○ | ○○○ | ○○○ | ○○X | ○XX | ○○X |
| reflow thermal resistance of multi-layer board | — | ○○○ | ○○○ | ○○○ | ○○X | ○○X | ○○○ |
| T300 thermal resistance | minute | >100 | >100 | >100 | >100 | 82 | >100 |

TABLE 3

Resin compositions of Examples (in part by weight) and test results

| Component | Name | E13 | E14 | E15 | E16 | E17 | E18 |
|---|---|---|---|---|---|---|---|
| vinyl-containing polyphenylene ether resin | SA-9000 | 50 | 50 | 50 | 50 | 20 | |
| | OPE-2st | | | | | 30 | 50 |
| bis(vinylphenyl)ethane | 1,2-bis(4-vinylphenyl)ethane | 30 | 30 | 30 | 20 | 25 | 30 |
| modification of divinylbenzene | A | 20 | 15 | 15 | | 15 | 15 |
| divinylbenzene | B | | | | 10 | | |
| | 1,4-divinylbenzene | | | | | | |
| triallyl isocyanurate resin | TAIC | | | | | | |
| methyl methacrylate resin | M55909 | | | | | | |
| ethylstyrene | 4-ethylstyrene | | | | | | |
| maleimide resin | BMI-3000 | 10 | | | | | |
| | BMI-70 | | 5 | | | | |
| | BMI-5100 | | | 5 | | | |
| polyolefin | Ricon 184MA6 | | | | | | |
| | Ricon 150 | | | | | | |
| | Ricon 100 | | | | | | 5 |
| | vinyl-HLBH | | | | | | 5 |
| silane coupling agent | KBM-1003 | | | | | | 0.5 |
| inorganic filler | SC-2500-SVJ | 30 | 30 | 30 | 30 | 30 | 45 |
| peroxide | 25B | 0.2 | 0.2 | 0.2 | 0.2 | 0.2 | 0.2 |
| solvent | toluene/MEK = 2:1 | PA | PA | PA | PA | PA | PA |
| Property | Unit | E13 | E14 | E15 | E16 | E17 | E18 |
| Dk@10 GHz | — | 3.11 | 3.15 | 3.13 | 3.08 | 3.09 | 3.12 |
| Df@10 GHz | — | 0.0017 | 0.0020 | 0.0020 | 0.0017 | 0.0018 | 0.0018 |
| P/S | lb/in | 3.02 | 3.02 | 3.03 | 3.05 | 3.14 | 3.21 |
| Tg (DMA) | ° C. | 211 | 255 | 249 | 222 | 233 | 238 |
| Z-axis ratio of thermal expansion | % | 2.29 | 2.16 | 2.14 | 2.24 | 2.13 | 2.32 |
| Z-axis thermal expansion coefficient | ppm/° C. | 44 | 39 | 41 | 46 | 38 | 46 |
| precipitation property of varnish | — | N | N | N | N | N | N |
| S/D | cycle | >20 | >20 | >20 | >20 | >20 | >20 |
| solder floating thermal resistance of multi-layer board | — | ○XX | ○○X | ○○X | ○○○ | ○○○ | ○○○ |
| reflow thermal resistance of multi-layer board | — | ○○X | ○○○ | ○○ | ○○○ | ○○○ | ○○○ |
| T300 thermal resistance | minute | 77 | >100 | >100 | >100 | >100 | >100 |

TABLE 4

Resin compositions of Comparative Examples (in part by weight) and test results

| Component | Name | C1 | C2 | C3 | C4 | C5 | C6 |
|---|---|---|---|---|---|---|---|
| vinyl-containing polyphenylene ether resin | SA-9000 | 50 | 50 | 50 | 50 | 50 | 50 |
| | OPE-2st | | | | | | |
| bis(vinylphenyl)ethane | 1,2-bis(4-vinylphenyl)ethane | 30 | 45 | 30 | | | |
| modification of divinylbenzene | A | | | | 15 | 45 | 15 |
| divinylbenzene | B | | | | | | |
| | 1,4-divinylbenzene | | | | | | |
| triallyl isocyanurate resin | TAIC | | | | 15 | | 30 |
| methyl methacrylate resin | M55909 | | | | | | |
| ethylstyrene | 4-ethylstyrene | | | | | | |
| maleimide resin | BMI-3000 | | | | | | |
| | BMI-70 | | | | | | |
| | BMI-5100 | | | | | | |
| polyolefin | Ricon 184MA6 | | | | | | |
| | Ricon 150 | | | | | | |
| | Ricon 100 | | | | | | |
| | vinyl-HLBH | | | | | | |
| silane coupling agent | KBM-1003 | | | | | | |
| inorganic filler | SC-2500-SVJ | 30 | 30 | 30 | 30 | 30 | 30 |
| peroxide | 25B | 0.2 | 0.2 | 0.2 | 0.2 | 0.2 | 0.2 |
| solvent | toluene/MEK = 2:1 | PA | PA | PA | PA | PA | PA |
| Property | Unit | C1 | C2 | C3 | C4 | C5 | C6 |
| Dk@10 GHz | — | 3.07 | 3.05 | 3.16 | 3.22 | 3.24 | 3.29 |
| Df@10 GHz | — | 0.0019 | 0.0018 | 0.0023 | 0.0020 | 0.0019 | 0.0025 |
| P/S | lb/in | 3.25 | 2.88 | 3.19 | 2.85 | 2.45 | 2.94 |
| Tg (DMA) | ° C. | 236 | 246 | 232 | 208 | 181 | 207 |

TABLE 4-continued

Resin compositions of Comparative Examples (in part by weight) and test results

| Component | Name | C1 | C2 | C3 | C4 | C5 | C6 |
|---|---|---|---|---|---|---|---|
| Z-axis ratio of thermal expansion | % | 2.27 | 2.07 | 2.32 | 2.68 | 2.51 | 2.64 |
| Z-axis thermal expansion coefficient | ppm/° C. | 42 | 36 | 46 | 63 | 55 | 62 |
| precipitation property of varnish | — | Y | Y | Y | N | N | N |
| S/D | cycle | >20 | 15 | 16 | 10 | 8 | 10 |
| solder floating thermal resistance of multi-layer board | — | ○○X | ○○X | ○○X | ○XX | XXX | ○XX |
| reflow thermal resistance of multi-layer board | — | ○○X | ○○X | ○○X | XXX | XXX | XXX |
| T300 thermal resistance | minute | >100 | >100 | >100 | 62 | 40 | 67 |

TABLE 5

Resin compositions of Comparative Examples (in part by weight) and test results

| Component | Name | C7 | C8 | C9 | C10 | C11 | C12 |
|---|---|---|---|---|---|---|---|
| vinyl-containing polyphenylene ether resin | SA-9000 | | | | 50 | 50 | 50 |
| | OPE-2st | | | | | | |
| bis(vinylphenyl)ethane | 1,2-bis(4-vinylphenyl)ethane | 30 | 80 | 30 | 30 | 30 | 20 |
| modification of divinylbenzene | A | 15 | 15 | 15 | | | |
| | B | | | | | | |
| divinylbenzene | 1,4-divinylbenzene | | | | 15 | 3 | 6 |
| triallyl isocyanurate resin | TAIC | | | 50 | | 10.5 | |
| methyl methacrylate resin | M55909 | | | | | 1.5 | |
| ethylstyrene | 4-ethylstyrene | | | | | | 4 |
| maleimide resin | BMI-3000 | | | | | | |
| | BMI-70 | | | | | | |
| | BMI-5100 | | | | | | |
| polyolefin | Ricon 184MA6 | | | | | | |
| | Ricon 150 | | | | | | |
| | Ricon 100 | | | | | | |
| | vinyl-HLBH | | | | | | |
| silane coupling agent | KBM-1003 | | | | | | |
| inorganic filler | SC-2500-SVJ | 30 | 30 | 30 | 30 | 30 | 30 |
| peroxide | 25B | 0.2 | 0.2 | 0.2 | 0.2 | 0.2 | 0.2 |
| solvent | toluene/MEK = 2:1 | PA | PA | PA | PA | PA | PA |
| Property | Unit | C7 | C8 | C9 | C10 | C11 | C12 |
| Dk@10 GHz | — | 3.01 | 2.99 | 3.22 | 3.06 | 3.15 | 3.08 |
| Df@10 GHz | — | 0.0017 | 0.0015 | 0.0025 | 0.0018 | 0.0023 | 0.0017 |
| P/S | lb/in | 1.45 | 1.12 | 1.43 | 2.77 | 3.16 | 3.04 |
| Tg (DMA) | ° C. | 248 | 262 | 245 | 230 | 227 | 219 |
| Z-axis ratio of thermal expansion | % | 1.92 | 1.75 | 2.08 | 2.36 | 2.29 | 2.47 |
| Z-axis thermal expansion coefficient | ppm/° C. | 32 | 30 | 43 | 56 | 47 | 57 |
| precipitation property of varnish | — | N | Y | N | Y | Y | Y |
| S/D | cycle | 5 | 6 | 6 | >20 | 15 | >20 |
| solder floating thermal resistance of multi-layer board | — | XXX | XXX | XXX | ○○X | ○○X | ○XX |
| reflow thermal resistance of multi-layer board | — | XXX | XXX | XXX | ○○○ | ○○X | ○XX |
| T300 thermal resistance | minute | 28 | 25 | 26 | 71 | >100 | 48 |

The following observations can be made according to the test results above.

Comparison of Examples E1 to E3 and Comparative Examples C1 to C3 indicates that, for a resin composition comprising a vinyl-containing polyphenylene ether resin but not including a bis(vinylphenyl)ethane and a modification of divinylbenzene at the same time, the absence of the modification of divinylbenzene, such as Comparative Examples C1 to C3, will cause one or more disadvantages including poor precipitation property of varnish, low solder floating thermal resistance of multi-layer board, low reflow thermal resistance of multi-layer board, and low solder dipping thermal resistance. As can be observed, the addition of a triallyl isocyanurate resin as a crosslinking agent commonly used with the polyphenylene ether resin to Comparative Example C3 fails to improve the disadvantages described above but deteriorates the dielectric constant and the dissipation factor.

Comparison of Examples E1 to E3 and Comparative Examples C4 to C6 indicates that, for a resin composition comprising a vinyl-containing polyphenylene ether resin but not including a bis(vinylphenyl)ethane and a modification of divinylbenzene at the same time, the absence of the bis (vinylphenyl)ethane, such as Comparative Examples C4 to C6, will cause one or more disadvantages including poor dielectric constant, low copper foil peeling strength, low glass transition temperature, poor Z-axis ratio of thermal expansion, poor Z-axis thermal expansion coefficient, low solder dipping thermal resistance, low solder floating thermal resistance of multi-layer board, low reflow thermal resistance of multi-layer board, and low T300 thermal resistance. As can be observed, the addition of a triallyl isocyanurate resin as a crosslinking agent commonly used with the polyphenylene ether resin to Comparative Example C6 fails to improve the disadvantages described above but deteriorates the dielectric constant and the dissipation factor.

Comparison of Examples E1 to E3 and Comparative Examples C7 to C9 indicates that, for a resin composition comprising a bis(vinylphenyl)ethane and a modification of divinylbenzene but not including a vinyl-containing polyphenylene ether resin, the absence of the vinyl-containing polyphenylene ether resin, such as Comparative Examples C7 to C9, will cause one or more disadvantages including low copper foil peeling strength, low solder dipping thermal resistance, low solder floating thermal resistance of multi-layer board, low reflow thermal resistance of multi-layer board, and low T300 thermal resistance. As can be observed, the addition of a triallyl isocyanurate resin to Comparative Example C9 fails to improve the disadvantages described above but deteriorates the dielectric constant and the dissipation factor.

Comparison of Examples E1 to E3 and Comparative Examples C10 to C12 indicates that, the use of a divinylbenzene in place of a modification of divinylbenzene, such as Comparative Example C10, will cause several disadvantages including low copper foil peeling strength, poor precipitation property of varnish and low solder floating thermal resistance of multi-layer board; instead of using a modification of divinylbenzene, individual presence of divinylbenzene, triallyl isocyanurate resin and methyl methacrylate resin, such as Comparative Example C11, will cause several disadvantages including poor dielectric constant, poor dissipation factor, poor precipitation property of varnish, low solder dipping thermal resistance, low solder floating thermal resistance of multi-layer board and low reflow thermal resistance of multi-layer board; instead of using a modification of divinylbenzene, individual presence of divinylbenzene and ethylstyrene, such as Comparative Example C12, will cause several disadvantages including poor precipitation property of varnish, low solder floating thermal resistance of multi-layer board, low reflow thermal resistance of multi-layer board and low T300 thermal resistance.

The above detailed description is merely illustrative in nature and is not intended to limit the embodiments of the subject matter or the application and use of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. A resin composition, comprising: a vinyl-containing polyphenylene ether resin, a bis(vinylphenyl)ethane and a modification of divinylbenzene, wherein the modification of divinylbenzene comprises a copolymer, a prepolymer or a derivative of divinylbenzene and a following component: methyl methacrylate resin, triallyl isocyanurate resin, triallyl cyanurate resin, ethylstyrene or a combination thereof.

2. The resin composition of claim 1, wherein the vinyl-containing polyphenylene ether resin comprises a vinylbenzyl-containing polyphenylene ether resin, a methacrylate-containing polyphenylene ether resin, an allyl-containing polyphenylene ether resin, a vinylbenzyl-modified bisphenol A polyphenylene ether resin, a chain-extended vinyl-containing polyphenylene ether resin or a combination thereof.

3. The resin composition of claim 1, wherein the bis(vinylphenyl)ethane comprises 1,2-bis(4-vinylphenyl)ethane, 1,2-(3-vinylphenyl-4-vinylphenyl)ethane, 1,2-bis(3-vinylphenyl)ethane or a combination thereof.

4. The resin composition of claim 1, further comprising: a maleimide resin, a small molecule vinyl compound, an acrylate, an epoxy resin, a cyanate ester resin, a phenolic resin, a benzoxazine resin, a styrene maleic anhydride, a polyolefin, a polyester resin, an amine curing agent, a polyamide resin, a polyimide resin or a combination thereof.

5. The resin composition of claim 1, further comprising: flame retardant, inorganic filler, curing accelerator, polymerization inhibitor, solvent, silane coupling agent, coloring agent, toughening agent or a combination thereof.

6. The resin composition of claim 1, comprising 50 parts by weight of the vinyl-containing polyphenylene ether resin, 5 to 40 parts by weight of the bis(vinylphenyl)ethane and 2 to 20 parts by weight of the modification of divinylbenzene.

7. The resin composition of claim 1, comprising 50 parts by weight of the vinyl-containing polyphenylene ether resin, 10 to 30 parts by weight of the bis(vinylphenyl)ethane and 5 to 15 parts by weight of the modification of divinylbenzene.

8. An article made from the resin composition of claim 1, comprising a prepreg, a resin film, a laminate or a printed circuit board.

9. The article of claim 8, having a dielectric constant and a dissipation factor at 10 GHz as measured by reference to JIS C2565 of less than or equal to 3.15 and of less than or equal to 0.0020 respectively.

10. The article of claim 8, having a copper foil peeling strength as measured by reference to IPC-TM-650 2.4.8 of greater than or equal to 3.00 lb/in.

11. The article of claim 8, having a glass transition temperature as measured by reference to IPC-TM-650 2.4.24.4 of greater than or equal to 200° C.

12. The article of claim 8, having a ratio of thermal expansion as measured by reference to IPC-TM-650 2.4.24.5 of less than or equal to 2.50%.

13. The article of claim 8, having a thermal expansion coefficient as measured by reference to IPC-TM-650 2.4.24.5 of less than or equal to 55 ppm/° C.

14. The article of claim 8, characterized in that no delamination occurs after subjecting the article to a solder dipping thermal resistance test of more than 20 cycles by reference to IPC-TM-650 2.4.23.

15. The article of claim 8, characterized in that no delamination occurs after subjecting the article to a solder floating thermal resistance test of multi-layer board of 20 cycles by reference to IPC-TM-650 2.4.13.1.

16. The article of claim 8, characterized in that no delamination occurs after subjecting the article to a 260° C. reflow thermal resistance test of multi-layer board of 10 cycles by reference to IPC-TM-650 2.6.27.

17. The article of claim 8, having a T300 thermal resistance as measured by reference to IPC-TM-650 2.4.24.1 of greater than 75 minutes.

* * * * *